(12) United States Patent
Seshan et al.

(10) Patent No.: US 6,352,940 B1
(45) Date of Patent: *Mar. 5, 2002

(54) SEMICONDUCTOR PASSIVATION DEPOSITION PROCESS FOR INTERFACIAL ADHESION

(75) Inventors: Krishna Seshan, San Jose; M. Lawrence A. Dass, Fremont; Geoffrey L. Bakker, San Jose, all of CA (US)

(73) Assignee: Intel Corporation, Santa Clara, CA (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/105,590

(22) Filed: Jun. 26, 1998

(51) Int. Cl.⁷ .................. H01L 21/31; H01L 21/469
(52) U.S. Cl. .................. 438/762; 438/765; 438/775; 438/786; 438/958
(58) Field of Search ................. 438/786, 791, 438/792, 624, 958, 761–763, 765, 769, 775, 776, 778

(56) References Cited

U.S. PATENT DOCUMENTS

| 4,091,406 A | * | 5/1978 | Lewis | 357/54 |
| 5,387,540 A | * | 2/1995 | Baccheta et al. | 257/639 |
| 5,773,325 A | * | 6/1998 | Teramoto | 438/151 |
| 5,795,821 A | * | 8/1998 | Baccheta et al. | 438/624 |
| 5,795,833 A | * | 8/1998 | Yu et al. | 438/763 |
| 5,807,787 A | * | 9/1998 | Fu et al. | 438/623 |
| 5,821,168 A | * | 10/1998 | Jain | 438/692 |
| 5,821,172 A | * | 10/1998 | Gilmer et al. | 438/769 |
| 5,825,078 A | * | 10/1998 | Michael | 257/632 |
| 5,972,804 A | * | 10/1999 | Tobin et al. | 438/786 |
| 6,046,101 A | * | 4/2000 | Dasss et al. | 438/624 |

* cited by examiner

Primary Examiner—Carl Whitehead, Jr.
Assistant Examiner—Jamie L. Brophy
(74) Attorney, Agent, or Firm—Blakely, Sokoloff, Taylor & Zafman LLP

(57) ABSTRACT

A method of passivating an integrated circuit (IC) is provided. An insulating layer is formed onto the IC. An adhesion layer is formed onto a surface of the insulating layer by treating the surface of the insulating layer with a gas and gas plasma. A first passivation layer is formed upon the adhesion layer, the first passivation layer and the gas and gas plasma including at least one common chemical element.

22 Claims, 10 Drawing Sheets

SEMICONDUCTOR PASSIVATION DEPOSITION PROCESS FOR INTERFACIAL ADHESION

BACKGROUND INFORMATION

1. Field of the Invention

The present invention relates to the field of integrated circuit fabrication and more particularly to the passivation of integrated circuit devices.

2. Description of Related Art

As part of the manufacturing process of integrated circuit devices, these devices undergo a series of tests to evaluate their performance and their survival in the field. Typical tests performed on these devices include, but are not limited to moisture, impurity penetration, reliability, and thermal cycling. The stresses caused by these tests, such as thermal cycling, result in failure of particular areas in the integrated circuit devices subjected to the tests. One area of failure is at the interface of the oxide and passivation layers of these devices. The oxide layer serves to protect the underlying wafer. The passivation layer, also called the hard passivation layer, serves to protect the components of the integrated circuit device during the testing and packaging processes and during use. Of course, other components such as metal lines may be formed between the oxide and the hard passivation layers. During the thermal cycling process, a lifting or delamination has been observed to occur at this interface. Delamination between the hard passivation layer and oxide layer also occurs during the saw process where individual devices are separated from a wafer or die. The saw process induces stresses into the wafer resulting in delamination at the interface between these layers.

Delamination affects the integrity of the device, because the separated hard passivation layer no longer entirely serves as a protectant against moisture or contamination. Delamination also contributes to production of stringers, residual material that interfere with further processing and testing of the integrated circuit. These negative influences on integrated circuit device integrity cause the device to lose its robustness. A loss of robustness is equivalent to a yield loss as the integrated circuit device is no longer suitable for a prescribed use.

It is desirable to provide a process for improving the adhesion between the oxide and the hard passivation layers of integrated circuit devices to reduce the delamination that occurs during the manufacturing process of these devices, such as thermal cycling and sawing.

SUMMARY OF THE INVENTION

The present invention provides a method of passivating an integrated circuit (IC). An insulating layer is formed onto the IC. An adhesion layer is formed onto a surface of the insulating layer by treating the surface of the insulating layer with a gas. A first passivation layer is formed upon the adhesion layer. The first passivation layer and the gas include at least one common chemical element.

BRIEF DESCRIPTION OF THE DRAWINGS

The features, aspects, and advantages of the present invention will become more fully apparent from the following Detailed Description, appended claims, and accompanying drawings in which:

DETAILED DESCRIPTION

In the following detailed description, numerous specific details are set forth such as material types, dimensions, processing steps, etc., to provide a thorough understanding of the invention. It is to be appreciated that these specific details need not be specifically adhered to in the practice of the invention. In other instances, well known elements and processing techniques have not been shown in particular detail in order to avoid unnecessarily obscuring the invention.

Figure 1:
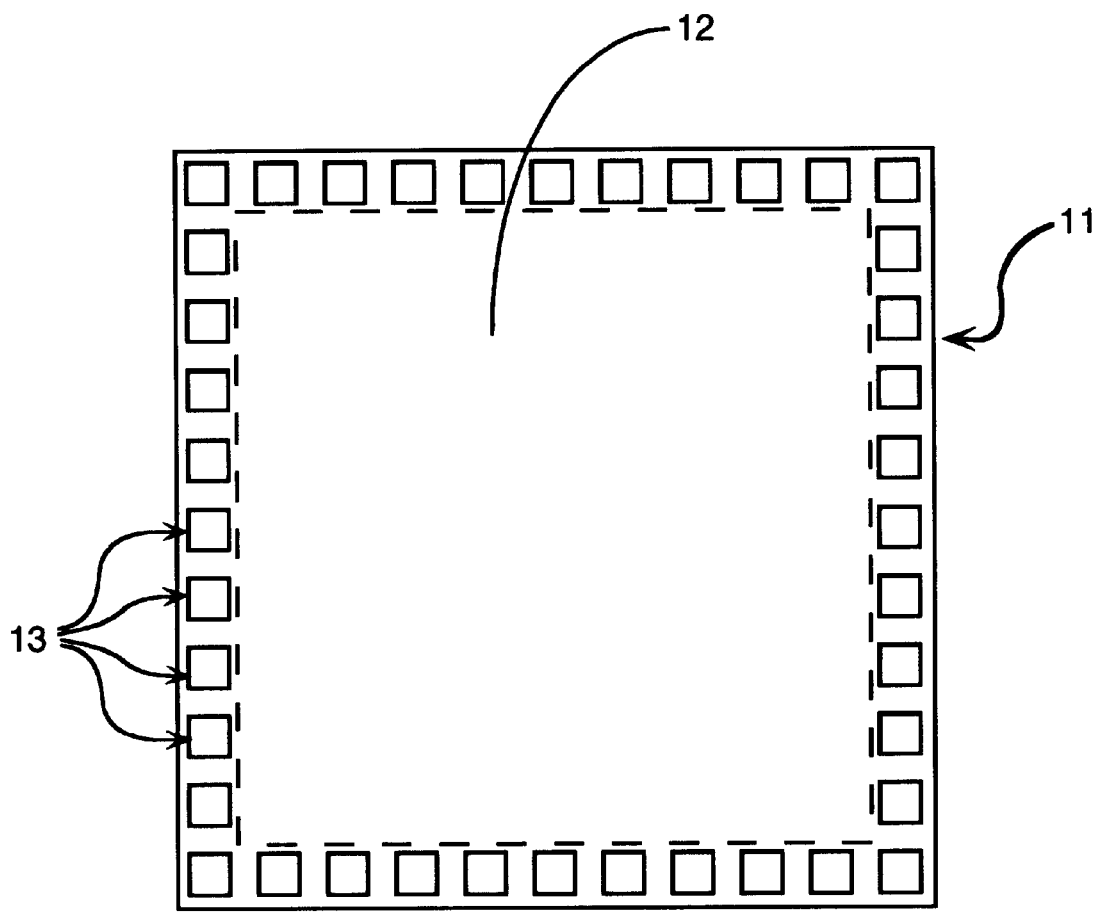
FIG. 1 illustrates a top view of an integrated circuit device designed for wire bond packaging.

FIG. 1 illustrates a surface view of the top side of an integrated circuit device. Metal interconnect lines and components of integrated circuit device 11 are formed on an underlying silicon substrate. The side of the silicon substrate on which the integrated circuit is formed shall herein be referred to as the top side of the silicon substrate. As illustrated in FIG. 1, bond pads 13 are located along the periphery of integrated circuit device 11. In the center of integrated circuit device 11 is the active region 12 containing the majority of the high density, active circuitry of integrated circuit device 11. To activate the circuitry within active region 12, it is necessary to supply voltage signals to bond pads 13. These voltage signals are supplied to bond pads 13 through a package to which integrated circuit device 11 is affixed.

Figure 2:
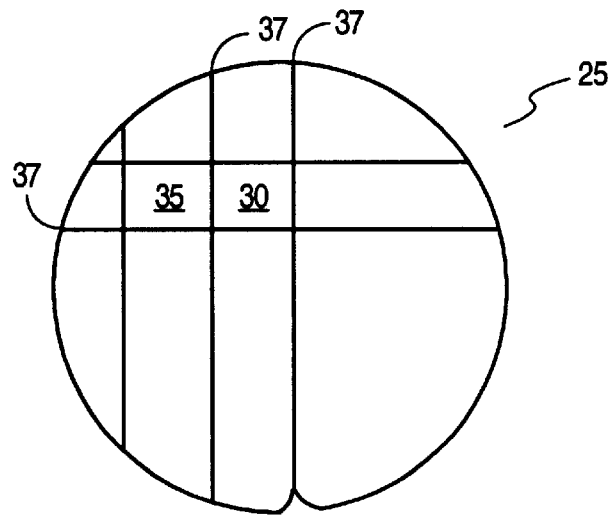
FIG. 2 illustrates a top view of a semiconductor wafer with a plurality of integrated circuit devices formed thereon.

Integrated circuit device 11 is fabricated with other devices on a wafer. FIG. 2 illustrates a top view of a wafer 25 having a plurality of integrated circuit devices, including devices 30 and 35 formed thereon. The individual devices 30 and 35 are separated from one another by scribe streets 37. Once individual devices 30 and 35 are fabricated and electrically tested, wafer 25 is cut or sawed along scribe streets 37 to separate the devices, e.g., individual microprocessors.

Figure 3:
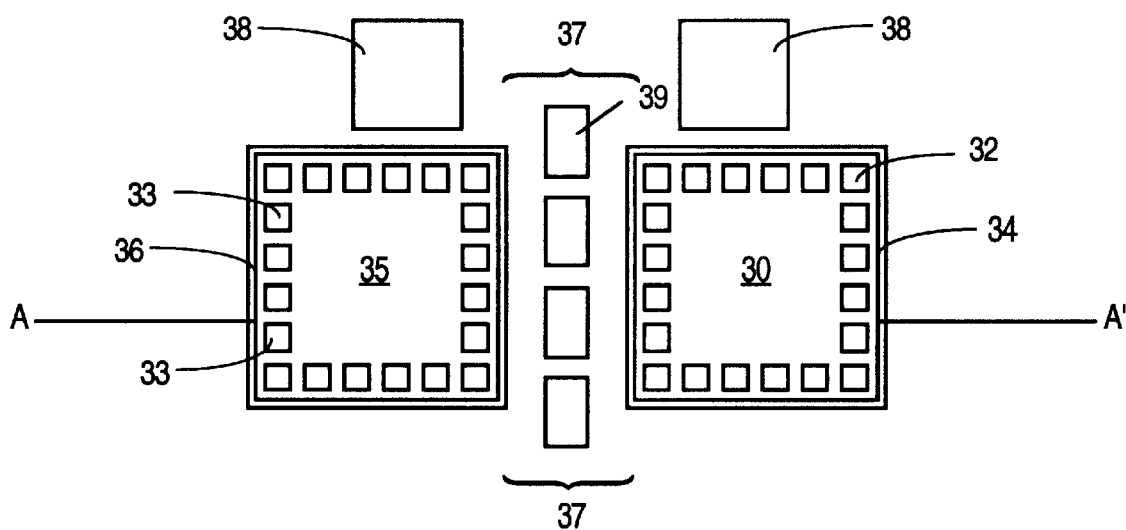
FIG. 3 illustrates a top view of two integrated circuit devices formed on the semiconductor wafer of FIG. 2.

FIG. 3 illustrates an expanded view of a portion of wafer 25 showing individual integrated circuit devices 30 and 35 separated by scribe street 37. Each integrated circuit device 30 and 35 includes bond pads 32 and 33, respectively, located around the periphery of the top surface of the respective integrated circuit devices. Each integrated circuit device 30 and 35 is surrounded by a guard ring 34 and 36, respectively. Guard rings 34 and 36 are generally formed of conductive material similar to bond pads 32 and 33, such as aluminum (Al), aluminum-copper (Al—Cu) alloy, or aluminum-copper-silicon (Al—Cu—Si) alloy. Guard rings 34 and 36 are placed on the outside of bond pads 32 and 33, respectively, and serve to protect integrated circuit devices 30 and 35, respectively.

As noted above, one purpose of scribe street 37 is to provide a sawing or cutting area to allow devices 30 and 35 to be separated. A second purpose of scribe street 37 is to provide an area to place test mechanisms to ascertain the viability and reliability of integrated circuit devices 30 and 35. FIG. 3 illustrates scribe street 37 having a plurality of electrical test pads, E-Test pads 39 that facilitate testing of bond pads 32 and 33 of integrated circuit devices 30 and 35, respectively. A third purpose of scribe street 37 is to provide a location for placing alignment marks, schematically illustrated in FIG. 3 by reference numeral 38. Alignment landmarks 38 are used by the fabrication tooling in placing and fabricating individual structures on devices 30 and 35.

Figure 4:
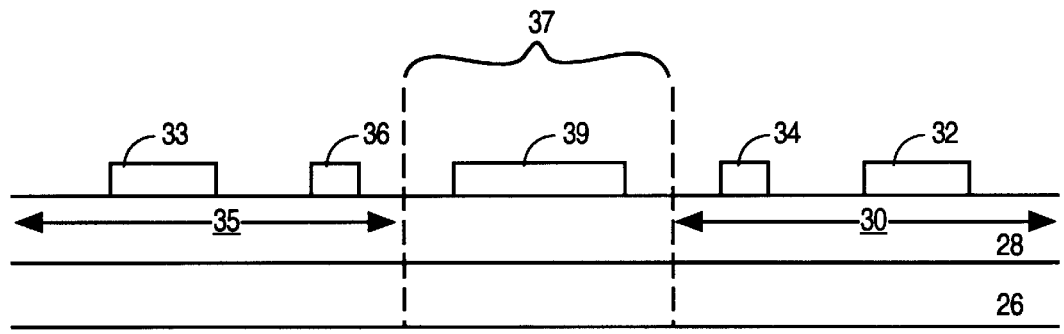
FIG. 4 illustrates a cross-sectional, side view of the integrated circuit devices of FIG. 3 taken through line A—A'.

FIG. 4 illustrates a cross-sectional side view of integrated circuit devices 30 and 35 taken through line A—A' of FIG. 3. FIG. 4 illustrates integrated circuit device 30 having bond pad 32 and guard ring 34, and integrated circuit device 35 having bond pad 33 and guard ring 36. Integrated circuit devices 30 and 35 are separated by scribe street 37. Scribe street 37 includes E-Test pad 39 for testing devices for integrated circuit 30 and/or 35.

FIG. 4 illustrates the top conductive (e.g., metal) line of the integrated circuit devices 30 and 35. The conductive line lies directly over a top insulating layer or oxide layer 28 of silicon dioxide, for example. Oxide layer 28 is formed over substrate 26. In general, after the devices are fabricated, bond pads 32 and 33, guard rings 34 and 36, and E-Test pad 39 lie beneath dielectric layers and must be exposed for testing and bonding to a suitable package. In a typical process, bond pads 32 and 33, guard rings 34 and 36, and E-Test pad 39 are covered by a hard passivation layer of silicon nitride ($Si_3N_4$), for example. Hard passivation layer may be physically bonded with or deposited by conventional deposition processes, such as plasma enhanced chemical vapor deposition (PECVD) onto oxide layer 28. This hard passivation layer is covered by a soft passivation layer of a photodefinable polyimide, for example. Together, the hard and soft passivation layers protect the device from the ambient such as scratches, moisture, and impurities.

Figure 5:
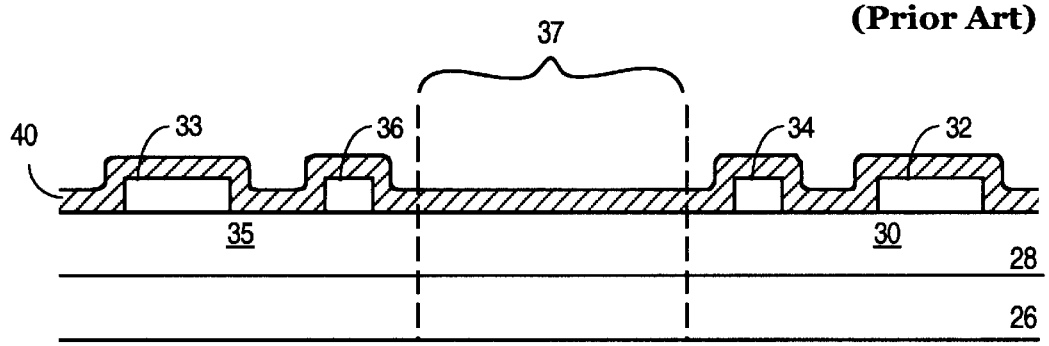
FIG. 5 illustrates a portion of the integrated circuit devices of FIG. 4 (E-Test pad omitted) with a hard passivation layer deposited thereon.
Figure 6:
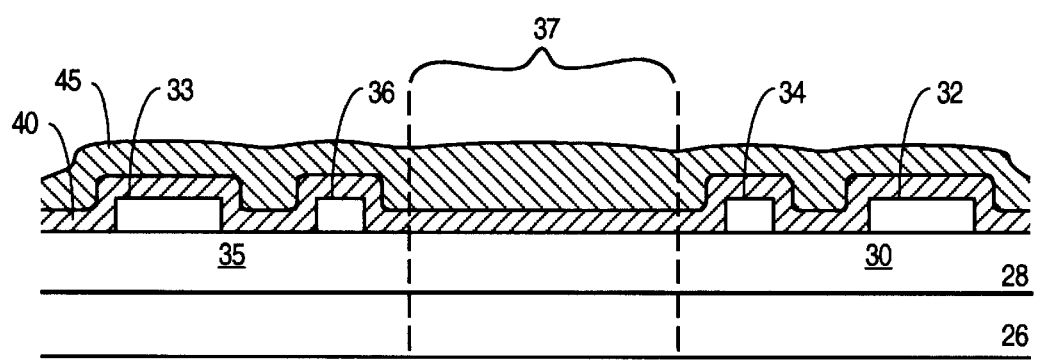
FIG. 6 illustrates a portion of the integrated circuit devices of FIG. 4 (E-Test pad omitted) with hard and soft passivation layers deposited thereon.
Figure 7:
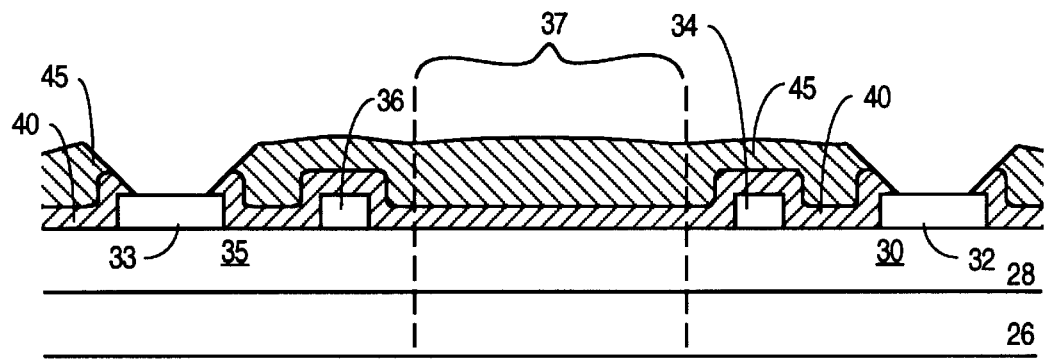
FIG. 7 illustrates a portion of the integrated circuit devices of FIG. 4 (E-Test pad omitted) with hard and soft passivation layers deposited thereon and with openings formed to metal bond pads.

FIGS. 5–7 illustrate cross-sectional sideviews of portions of adjacent integrated circuit devices of a semiconductor-based wafer undergoing the prior art process for exposing bond pads 32 and 33 of integrated circuit devices 30 and 35, respectively. As shown in FIG. 5, overlying portions of oxide layer 28 and the metal structures of integrated circuit devices 30 and 35 is a conformally deposited hard passivation layer 40, such as silicon nitride, for example. Next, as shown in FIG. 6, soft passivation layer 45, such as a photodefinable polyimide, for example, is deposited over hard passivation layer 40.

FIG. 7 illustrates a cross-sectional sideview of a portion of adjacent integrated circuit devices undergoing the processing steps of exposing bond pads 32 and 33 of integrated circuit devices 30 and 35, respectively. As a first step, photodefinable polyimide layer 45 is exposed to a light source. Portions of photodefinable polyimide layer 45 above bond pads 32 and 33 are protected from light exposure. The remaining photodefinable polyimide layer 45 is exposed and developed. During development, the unexposed region of photodefinable polyimide layer 45 is dissolved, exposing silicon nitride hard passivation layer 40 in those areas. Next, the remaining polyimide material is cured at high temperature. The exposed silicon nitride hard passivation layer 40 is then etched to remove silicon nitride from areas above bond pads 32 and 33. A suitable etchant is, for example, a $NF_3$/He and $SF_6$/He etch chemistries.

Figure 8A:
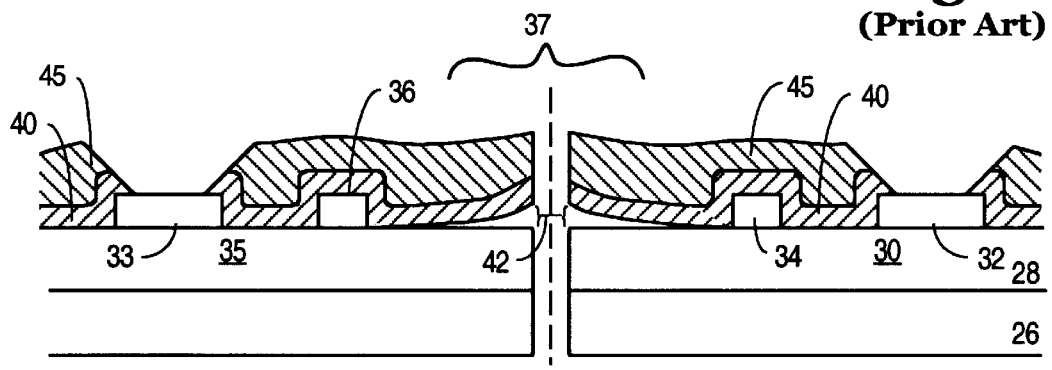
FIG. 8a illustrates a portion of the wafer including the integrated circuit devices of FIG. 4 (E-Test pad omitted) showing delamination when the wafer is cut through a scribe street area.
Figure 8B:
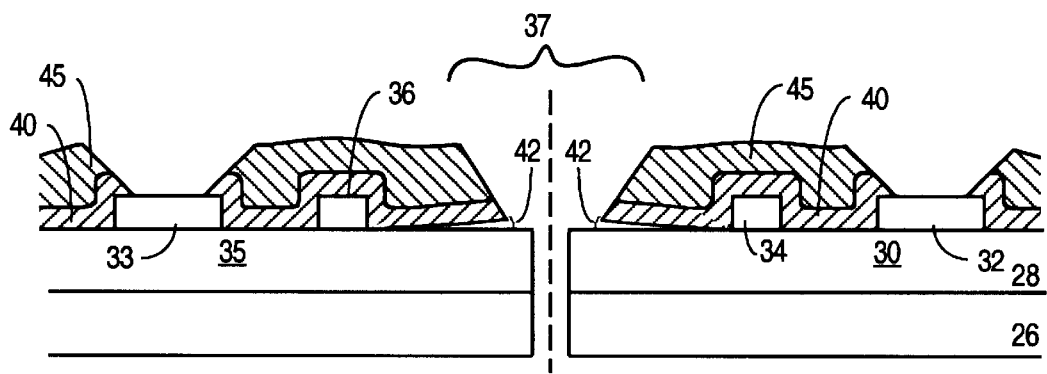
FIG. 8b illustrates a portion of the wafer including the integrated circuit devices of FIG. 4 (E-Test pad omitted) showing delamination when the wafer is cut through an exposed scribe street area.
Figure 8C:
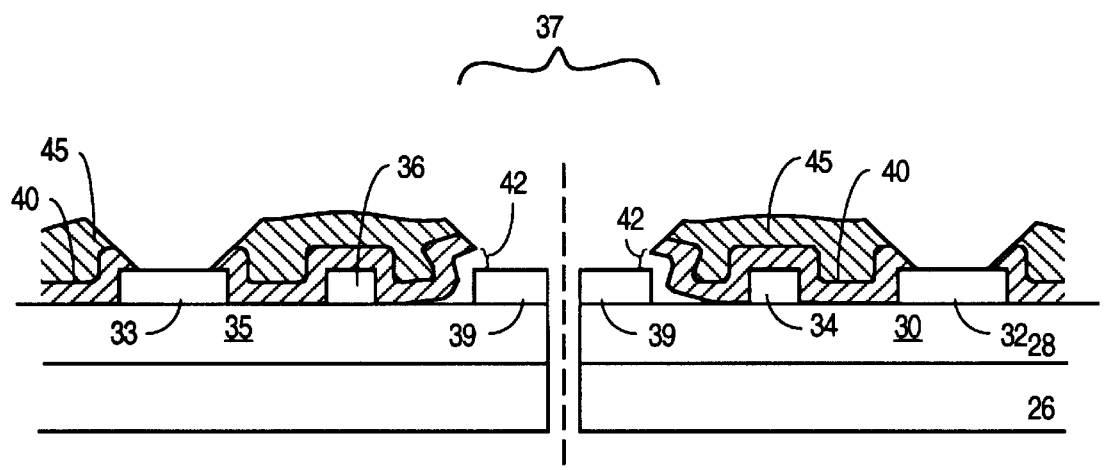
FIG. 8c illustrates a portion of the wafer including the integrated circuit devices of FIG. 4 showing delamination when the wafer containing exposed E-Test pad is cut through the scribe street area.

As shown in FIG. 7, hard passivation layer 40 and soft passivation layer 45 remain in a portion of scribe street area 37 although bond pads 32 and 33 are partially exposed. Bond pad 32 of integrated circuit device 30 and bond pad 33 of integrated circuit device 35 can be tested at this time. Once the devices are tested, passing devices are cut from the wafer and placed in a package. FIGS. 8a, 8b, and 8c illustrate the sawing process wherein various wafers are sawed through scribe street 37 to separate integrated circuit device 30 from integrated circuit device 35.

Once the integrated circuit devices are separated and placed in a package, the devices undergo a series of tests to evaluate their performance and their survival in the field. Various tests are done including, but not limited to, thermal cycling, moisture tests, impurity penetration, and reliability tests.

These tests typically induce stresses and cause failure in the integrated circuit devices. One area of particular concern is at the interface of the oxide and hard passivation layers, particularly in the area of the scribe street. It has been observed that during the thermal cycling process, a lifting or delamination occurs at this interface. Of particular concern is that once this lifting or delamination occurs, it can progress all the way underneath the metal lines thus causing damage to the device. This delamination is illustrated by reference numeral 42 in FIGS. 8a, 8b, and 8c. It is believed that the delamination occurs because the interface between silicon dioxide oxide layer 28 and silicon nitride hard passivation layer 40, for example, has poor adhesion.

Delamination between hard passivation layer 40 and oxide layer 28 is also seen during the saw process where individual devices are separated. The saw cutting process induces stress into the wafer resulting in delamination at the interface between oxide layer 28 and hard passivation layer 40.

FIG. 8a illustrates delamination 42 that occurs when a conventional wafer is sawed through scribe street area 37 to separate integrated circuit device 30 from integrated circuit device 35. FIG. 8b illustrates delamination 42 that occurs when the wafer is sawed through an exposed scribe street area 37. Note that exposing the scribe street area may reduce the occurrence of delamination but it is believed that the exposure of the scribe street area does not eliminate such. FIG. 8c illustrates delamination 42 that occurs when a wafer containing exposed E-Test pad 39 is sawed through scribe street area 37. E-Test pad 39 may be included in a wafer for the purposes of testing scribe line test structures.

The present invention provides a process for passivating an integrated circuit that confers improved adhesion between an insulating or oxide layer and a hard passivation or passivation layer of an integrated circuit. The process causes reduction in delamination between an insulating layer and a hard passivation layer. Prior to the deposition of the hard passivation layer a plasma process is performed. According to one embodiment of the present invention where the oxide insulating layer includes silicon dioxide, the oxide layer is treated with nitrous oxide ($N_2O$), by way of a nitrous oxide plasma process, to form an adhesion layer of silicon oxynitride ($Si_xO_yN_z$) on the surface of the oxide layer. In one embodiment of the process of the present invention where the hard passivation layer includes silicon nitride ($Si_xN_y$), by treating the surface of the oxide layer with nitrous oxide, the oxide surface of the oxide layer gradually changes. The pure oxide from the oxide layer gradually transitions into a layer including nitrogen (N), such as silicon oxynitride. The oxide layer's surface is thus transformed into a layer similar to the hard passivation silicon nitride layer to be deposited, resulting in a strong chemical bond between the oxide layer and the silicon nitride layer. The interface between the oxide layer and the silicon nitride layer becomes less abrupt. The nitrous oxide treatment also acts as a cleaning agent by removing contaminants and residues formed in the fabrication processes.

FIGS. 9–15 illustrate cross-sectional side views of portions of adjacent integrated circuit devices of a semiconductor-based wafer undergoing a fabrication process according to one embodiment of the process of the present invention, of forming integrated circuits such as, for example, microprocessors.

Figure 9:
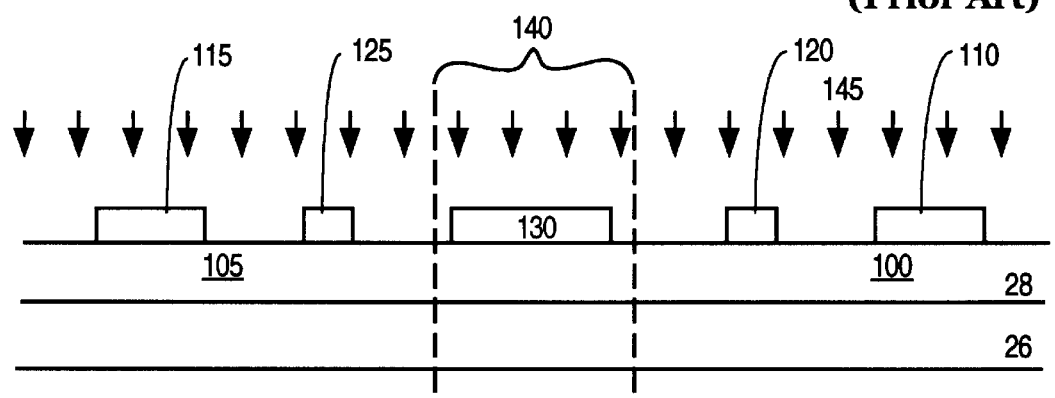
FIG. 9 illustrates a portion of a pair of integrated circuit devices on a wafer separated by a scribe street area and exposed to a nitrous oxide gas in accordance with one embodiment of the present invention.

FIG. 9 illustrates a cross-sectional view of adjacent integrated circuit devices 100 and 105 separated by a scribe street area 140. The top surfaces of integrated circuit devices 100 and 105 include bond pads 110 and 115, respectively. The top surfaces of these integrated circuits also include guard rings 120 and 125, respectively, that surround the periphery of individual devices and serve a protective function. Guard rings and their roles in integrated circuits are well-known in the art. The top surface of scribe street area 140 includes E-Test pad 130. In one embodiment of the present invention, bond pads 110 and 115, guard rings 120 and 125, and E-Test pad 130 include the same conductive material. Typical conductive material includes, but is not limited to, aluminum, aluminum-copper alloy, and aluminum-copper-silicon alloy. According to one embodiment of the process of the present invention, the conductive material includes titanium nitride (TiN), anti-reflective coating (ARC) layer overlying an aluminum-copper alloy overlying a layer of titanium. The conductive material structures lie directly over an insulating dielectric layer such as a terminal oxide layer 28. Oxide layer 28 may include silicon oxide based materials.

In FIG. 9, the top surfaces of the integrated circuits and of the scribe street area undergo a gas or plasma 145 treatment. As an optional preliminary step to performing the plasma treatment, terminal oxide layer 28 may be treated by a plasma such as argon (Ar) to clear residues off the surface of oxide layer 28. Oxide layer 28 and the conductive material structures (bond pads 110 and 115, guard rings 120 and 125, and E-Test pad 130) are treated by vapor plasma 145 that may include at least one common chemical element (also included in the hard passivation layer). In one embodiment of the process according to the present invention, oxide layer 28 and the conductive material structures are plasma treated with nitrous oxide ($N_2O$). Other gases such as oxygen with nitrogen (N), oxygen with ammonia ($NH_3$), oxygen with Argon (Ar), oxygen with fluorine, or ozone ($O_3$) with argon may also be used to treat the above-mentioned structures.

Figure 10:
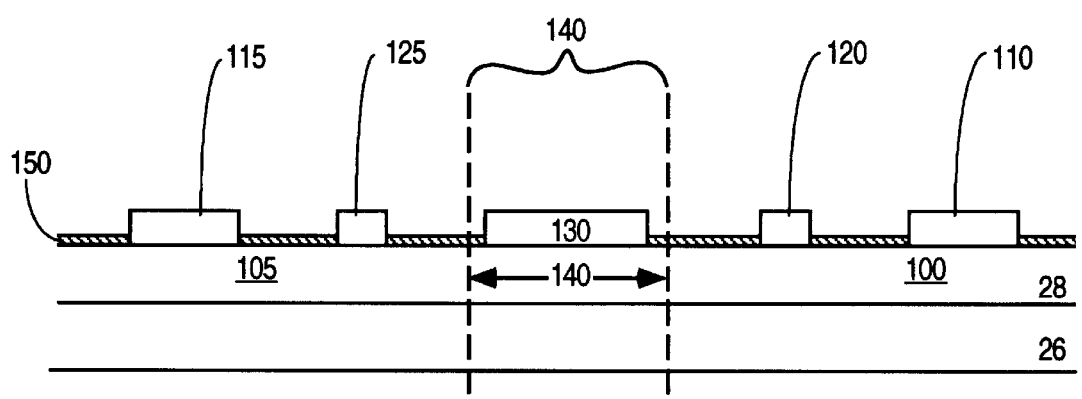
FIG. 10 illustrates the integrated circuit devices of FIG. 9 with an adhesion layer formed thereon in accordance with one embodiment of the present invention.

FIG. 10 illustrates a cross-sectional view through portions of adjacent integrated circuits subjected to the embodiment of the process according to the present invention. An adhesion layer 150, over the top surface of oxide layer 28, but not on the sidewalls or top surface of the conductive material structures is formed as a result of the treatment of oxide layer 28 with the plasma vapor 145. In the embodiment of the process according to the present invention, nitrous oxide plasma vapor 145 causes micro roughening on the surface of oxide layer 28. It is well-known in the art that micro roughening at the interface between two materials improves the adhesion between these materials. In the embodiment of the process of the present invention, where oxide layer 28 includes silicon dioxide, nitrous oxide vapor plasma 145 reacts with silicon dioxide to form adhesion layer 150 of silicon oxynitride ($Si_xO_yN_z$) on the surface of oxide layer 28. Adhesion layer 150 confers strong chemical bonding to oxide layer 28 and to a hard passivation layer (not shown) deposited on adhesion layer 150 later in the process.

It is also well-known that nitrous oxide plasma vapor 145 also acts as a cleaning agent. Various contaminants may exist on the surface of oxide layer 28 such as hydrocarbons from the fabrication ambient and fluorine residues from metal etch. Nitrous oxide vapor plasma 145 aids in the removal of these and other contaminants prior to the deposition of a hard passivation layer on top thereof.

In one embodiment of the process, the hard passivation layer includes silicon nitride which includes nitrogen (N). Treating the surface of oxide layer 28 with nitrous oxide vapor plasma 145, which also contains nitrogen (N), causes gradual change in the surface of oxide layer 28. When the surface of oxide layer 28 is treated with nitrous oxide vapor plasma 145, the pure oxide from the surface of oxide layer 28 gradually transitions into a layer containing nitrogen (N)—silicon oxynitride. The surface of oxide layer 28 is thus transformed into a layer including at least a same chemical element as that included in the hard passivation silicon nitride layer to be deposited. As the interface between the oxide and hard passivation layers becomes less abrupt, forming better adhesion between these two layers, strong chemical bonding between these two layers results.

Adhesion layer 150 has a thickness sufficient to improve adhesion between the oxide and hard passivation layers. In one embodiment, adhesion layer 150 of silicon oxynitride has a thickness of approximately a few monolayers.

It is to be appreciated that the processing steps explained in connection with FIGS. 9 and 10 are not limited to the treatment of the terminal oxide layer, but any oxide layer to be passivated may undergo the steps of the embodiment of the process described herein.

Figure 11:
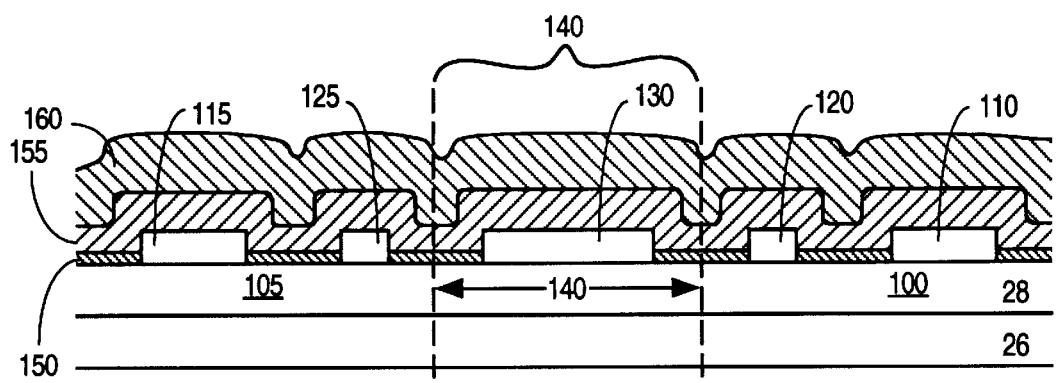
FIG. 11 illustrates the integrated circuit devices of FIG. 9 with an adhesion layer, a hard passivation layer, and a soft passivation layer formed thereon in accordance with one embodiment of the present invention.

FIG. 11 illustrates a cross-sectional side view through the portions of the integrated circuits in connection with a further processing step of the embodiment of the process described herein. Hard passivation layer 155 is deposited over a top surface of adhesion layer 150, bond pads 110 and 115, guard rings 120 and 125, and E-Test pad 130. Hard passivation layer 155 serves to protect the integrated circuit from environmental contaminants, particularly from moisture and ions. Deposition of hard passivation layer 155 may be by conventional deposition processes, such as plasma enhanced chemical vapor deposition (PECVD). Hard passivation layer 155 may include, for example, silicon nitride, boron nitride, or carbon nitride. In one embodiment of the process according to the present invention, hard passivation layer 155 includes silicon nitride. Silicon nitride hard passivation layer 155 contains nitrogen (N), the same chemical element found in nitrous oxide gas 145. Hard passivation layer 155 is conformally deposited over the above-mentioned structures to a thickness of about 1 $\mu$m or less. Soft passivation layer is then deposited on hard passivation layer 155. Soft passivation layer 160 may also be deposited by PECVD. In one embodiment of the process according to the present invention, soft passivation layer 160 is a photodefinable polyimide layer spun to a thickness of approximately 11.5 $\mu$m, which reduces to a thickness of approximately 3 $\mu$m at the end of processing.

Figure 12:
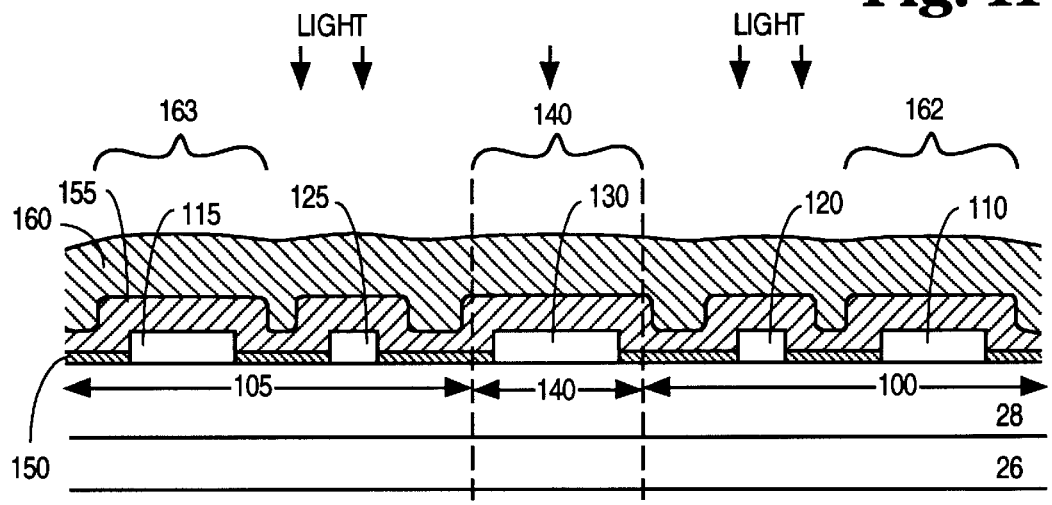
FIG. 12 illustrates the integrated circuit devices of FIG. 9 where the soft passivation layer is exposed to a light source.

FIG. 12 illustrates a cross-sectional side view through the portions of the integrated circuits in connection with a further processing step of one embodiment of the process according to the present invention. The top surfaces of integrated circuit devices 100 and 105 and the top surface of scribe street area 140 are exposed to light emitted by a light source. During this step, portions 162 and 163 of polyimide layer 160 and a portion of polyimide layer 160 indirectly overlying bond pads 110 and 115, and all of scribe street area 140, respectively, are protected from light exposure by a mask (not shown). The remaining photodefinable polyimide layer 160 is exposed to ultraviolet light and developed. During development, the unexposed areas of photodefinable polyimide layer 160 are dissolved by conventional etchants such as isopropyl alcohol, thereby causing exposure of hard passivation layer 155 in those areas. The exposed areas of photodefinable polyimide layer 160 react to light by cross-linking and hardening and are thus not removed by the etchant.

It is to be appreciated by persons skilled in the art that soft passivation layer 160 is not limited to polyimide. Other soft passivation layer materials, such as polyimides or other organic materials, may be used. Conventional techniques such as photolithography that use a resist or wet etching may be used to expose hard passivation layer 155.

In the embodiment where soft passivation layer 160 is a photodefinable polyimide, the remaining polyimide material is cured such as, for example, by exposing the wafer to a temperature of approximately 400° C. During cure, polymer chains cross-link and solvent is driven away causing polyimide layer 160 to become harder. The curing process results in some outgassing and formation of deposits/contaminants above the exposed hard passivation layer 155. During the curing step the presence of hard passivation layer 155 and adhesion layer 150 protect conductive structures 110, 115, and 130 from deposition of and oxidation by contaminants.

Once soft passivation layer 160 is cured, the exposed hard passivation layer 155 is etched to form openings to bond pads 110 and 115 and to remove passivation layer material from scribe street area 140. Adhesion layer 150 is also removed in these areas. In the embodiment where hard passivation layer 155 includes silicon nitride and adhesion layer 150 includes silicon oxynitride, a plasma etch process that removes both silicon oxynitride and silicon nitride is performed. In the case where the integrated circuits include a multi-layer conductive material such as the TiN ARC layer described above, this material may be removed at this step. A typical etchant that may etch silicon oxynitride, silicon nitride, and the TiN ARC layer may include for example, a $NF_3$/He and $SF_6$/He.

Figure 13:
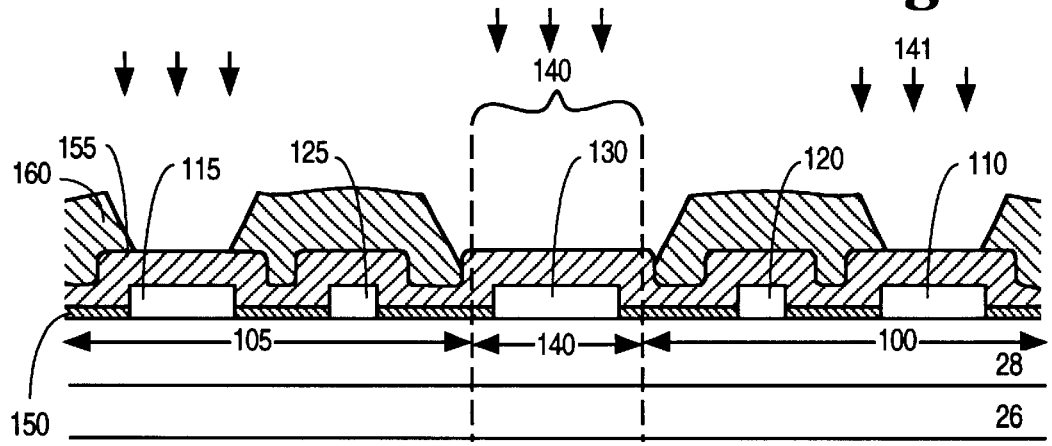
FIG. 13 illustrates the integrated circuit devices of FIG. 9 where openings are formed through the soft passivation layer above bond pad areas and the scribe street area in accordance with one embodiment of the present invention.

FIG. 13 illustrates a cross-sectional view through the portions of the integrated circuits during the etching step, where the arrows 141 denote the etching performed upon the above-mentioned area. In the embodiment of the process described herein, the silicon oxynitride/silicon nitride etch chemistry contains fluorine. In the process of etching, it is possible that some residues containing fluorine may have been left on the surface of bond pads 110 and 115 and E-Test pad 130 or on soft passivation layer 160. When residual fluorine remains on the surface of the conductive materials, fluorine might inhibit the bonding between the package and the bond pads or the testing of the bond pads with the E-Test pad. To remove residual fluorine, an optional, very short duration, sputter etch (a safety etch) may be performed.

Figure 14:
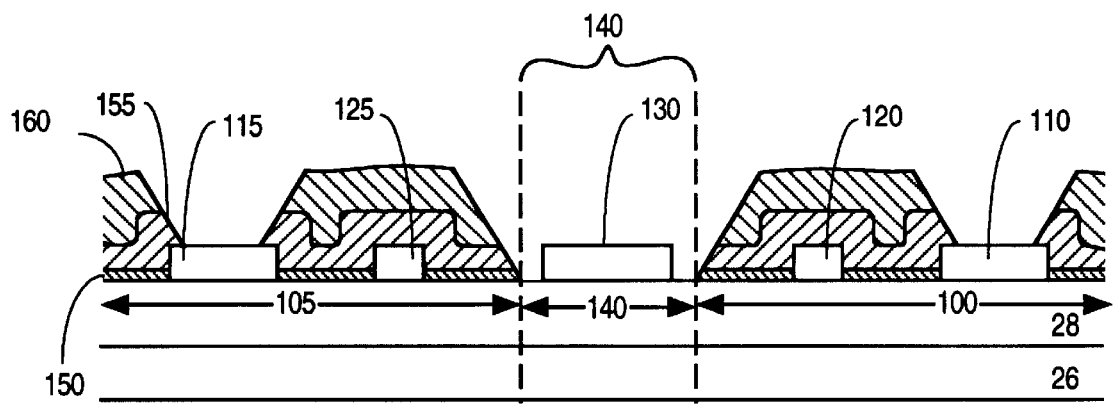
FIG. 14 illustrates the integrated circuit devices of FIG. 9 where openings are formed through the hard passivation layer and the adhesion layer to the bond pads and in the scribe street area in accordance with one embodiment of the present invention.

FIG. 14 illustrates a cross-sectional view through the portions of the integrated circuits with exposed bond pad 110 and 115 and exposed scribe street area 140 after the hard passivation layer and adhesion layer have been etched and optionally sputter etched. Once bond pads 110 and 115 and E-Test pad 130 are exposed, integrated circuit devices 100 and 105, respectively, are electrically tested using E-Test pad 130 and then sorted using bond pads 110 and 115 for proper operation. The wafer is tested for quality and then the devices are sorted in terms of performance, integrity, and robustness.

Figure 15:
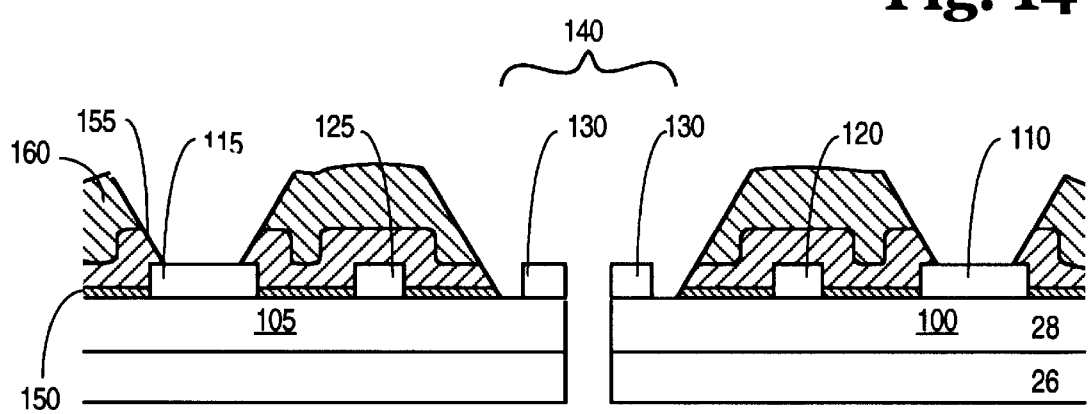
FIG. 15 illustrates the integrated circuit devices of FIG. 9 where the integrated circuit devices are separated through the scribe street area.

FIG. 15 illustrates integrated circuit devices 100 and 105 separated from one another by a sawing process for example, through scribe street area 140. As scribe street area 140 is free of hard and soft passivation layer materials, the sawing process does not induce damage to devices 100 and 105 and delamination of soft passivation layer 160 or of hard passivation layer 145.

Once the sawing process is complete and the individual integrated circuit devices are isolated, integrated circuit device 100 (or integrated circuit device 105) is individually placed in a package and bonded to the package via a wire bond. At this point, integrated circuit device 100 (or integrated circuit device 105) is again tested for integrity and performance through a battery of tests including thermal cycling, moisture resistance, impurity penetration resistance, reliability, etc.

During thermal cycling, for instance, thermal stresses are particularly damaging to the device passivation, causing, for example, delamination. The presence of adhesion layer 150 between oxide layer 28 and hard passivation layer 155 reduces the amount of delamination experienced in prior art structures during thermal cycling. Accordingly, the integrity of the packaged device formed by the embodiment of the process of the present invention is greater than in prior art devices, thus yielding a more robust integrated circuit device.

The embodiment of the process of the present invention explained in connection with FIGS. 9–15, was described with reference to integrated circuit devices intended for wire bond packaging. It is to be appreciated that the same technology may be used in connection with Controlled Collapse Chip Connection (C4) platform technology. In C4 technology, the entire integrated circuit device or unit is assembled to the package, typically through solder bumps. Thermal stresses experienced by a C4 platform tend to be much greater than the thermal stresses experienced for a wire bond platform. Accordingly, the benefits of utilizing an adhesion layer between oxide and hard passivation layers overlying a C4 fabricated device and the freeing of scribe street areas from passivation in such a device is particularly beneficial.

Figure 16:
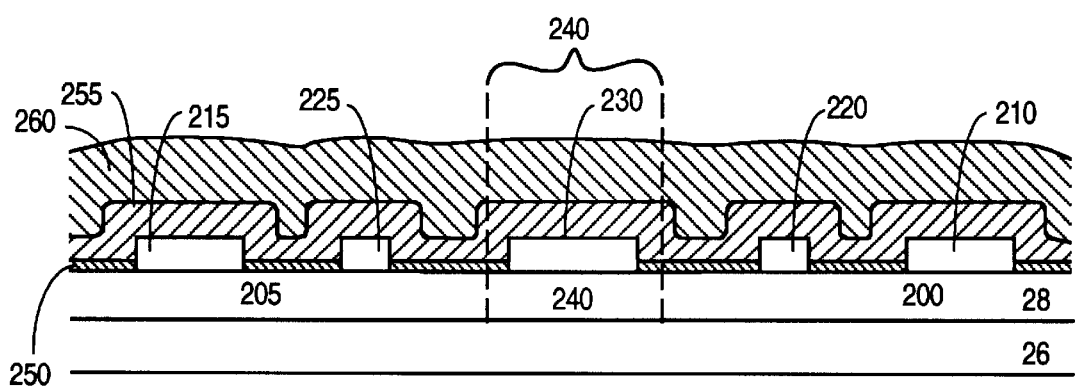
FIG. 16 illustrates a portion of a pair of integrated circuit devices on a semiconductor wafer separated by a scribe street area with an adhesion layer, a hard passivation layer, and a soft passivation layer formed thereon in accordance with a second embodiment of the method of the present invention.
Figure 17:
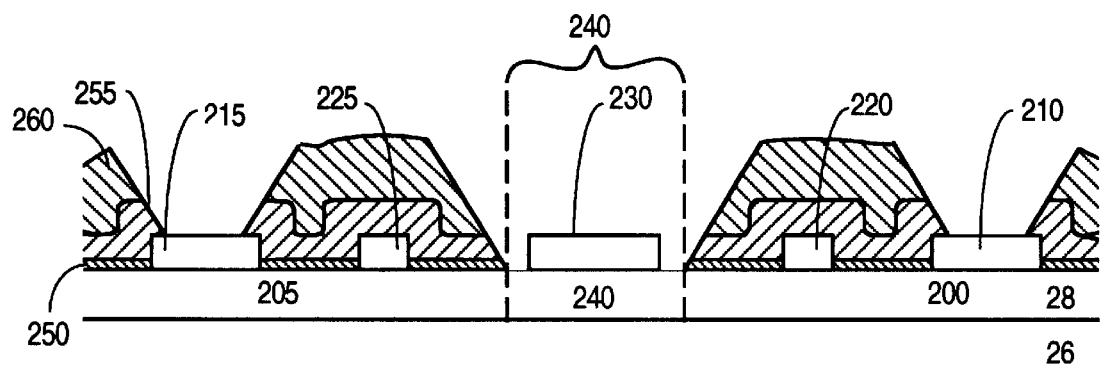
FIG. 17 illustrates the integrated circuit devices of FIG. 16 showing openings to bond pads and removal of passivation material from a scribe street area in accordance with a second embodiment of the method of the present invention.
Figure 18:
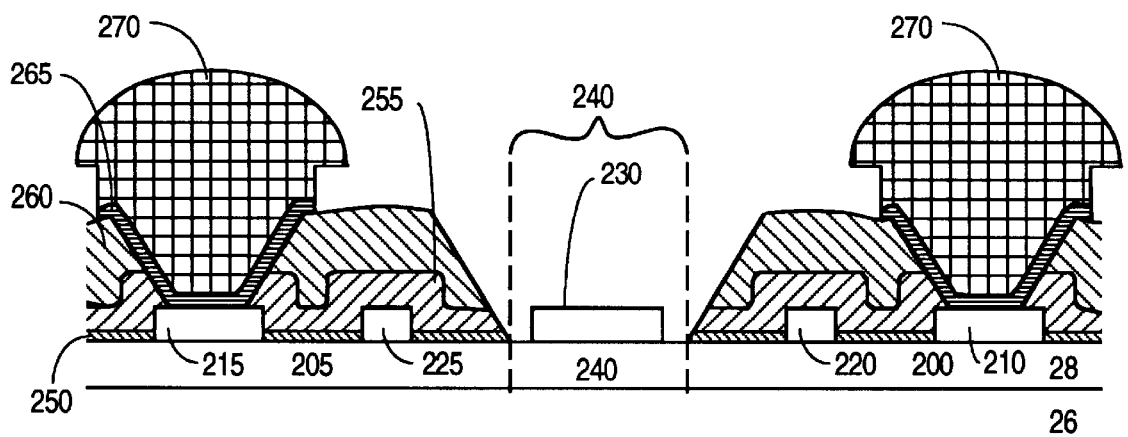
FIG. 18 illustrates the integrated circuit devices of FIG. 16 showing solder bumps formed over bond pads of the integrated circuit devices in accordance with a second embodiment of the method of the present invention.

FIGS. 16–18 illustrate cross-sectional views through the portions of the integrated circuits in connection with the process described in connection with FIGS. 9–15 for use with a C4 platform integrated circuit devices 200 and 205. In FIG. 16, integrated circuit devices 200 and 205 are separated by a scribe street area 240. Integrated circuit devices 200 and 205 include conductive material bond pads 210 and 215, respectively, and guard rings 220 and 225, respectively. Scribe street area 240 contains E-Test pad 230. Adjacent the top surface of oxide layer 28 is an adhesion layer 250 of silicon oxynitride, for example. Overlying the conductive structures of the wafer is a first hard passivation layer of silicon nitride, for example. In one embodiment, the silicon oxynitride layer is formed by exposing oxide layer 28 of silicon dioxide to a nitrous oxide ($N_2O$) treatment. Overlying hard passivation layer 255 is soft passivation layer 260 of photodefinable polyimide, for example. For a more detailed description of the formation of hard passivation layer 255, soft passivation layer 260, and adhesion layer 250, reference is made to FIGS. 9–12 and the accompanying text.

In FIG. 17, bond pads 210 and 215 of integrated circuit devices 200 and 205, respectively, are exposed as described above with reference to FIGS. 13 and 14 and the accompanying text. FIG. 17 also shows that passivation layers 255 and 260 and adhesion layer 250 have been removed from scribe street area 240. At this point, integrated circuit devices 200 and 205 are sorted using bond pads 210 and 215 and device quality is electrically tested by using E-Test pads, such as for example, E-Test pad 230 throughout the scribe street areas of the wafer.

In FIG. 18, solder bumps 270 are shown formed over bond pads 210 and 215 of integrated circuit devices 200 and 205, typically over a base layer(s) of conductive material 265. Once solder bumps 270 are formed onto the individual bond pads, integrated circuit devices 200 and 205 are separated via a sawing process as described above with reference to FIG. 15 and the accompanying text. At this point, the individual devices are packaged by inverting the devices and placing them in an organic package, for example. Once packaged, the integrated circuit devices are subjected to several tests as described above in connection with the wire bond packaged devices.

The passivation technology of the present invention was described above with reference to an integrated circuit device intended for wire bond and C4 bond packaging. It is to be appreciated that the same technology may be used for passivating trenches and spacers of integrated circuit devices.

Figure 19:
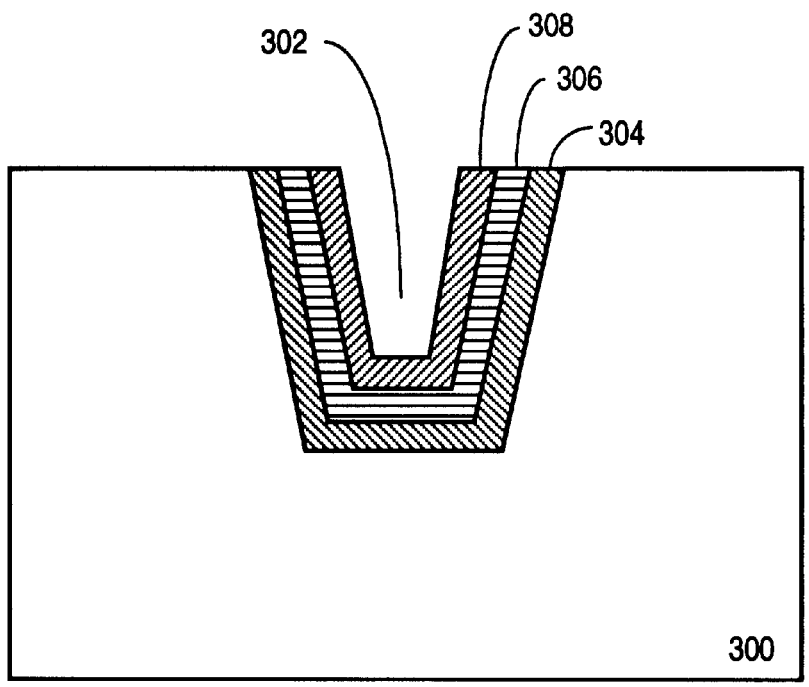
FIG. 19 illustrates a portion of a semiconductor substrate showing a trench with an insulating layer, an adhesion layer, and a passivation layer formed thereon in accordance with a third embodiment of the method of the present invention.

FIG. 19 illustrates a portion of semiconductor device with a trench formed therein. A trench 302 is formed in a substrate 300. Trench 302 is passivated with an oxide layer 304, an adhesion layer 306, and a passivation layer 308 in accordance with one embodiment of the present invention. Trench formation is well-known in the art and employs conventional processing steps and processing equipment. Oxide layer 304, such as silicon dioxide, is formed over the sidewalls and base of trench 302. Oxide layer 304 may be deposited or grown in accordance with conventional techniques. Oxide layer 304 is then exposed to a plasma treatment such as a nitrous oxide gas treatment to form adhesion layer 306. In the embodiment where oxide layer 304 is made of silicon dioxide, the nitrous oxide reacts with the silicon dioxide to form an adhesion layer 306 of silicon oxynitride ($SiO_XN_Y$). A passivation layer 308, made of silicon nitride, for example, is further deposited over adhesion layer 306 resulting in a strong chemical bond between the two layers.

Figure 20:
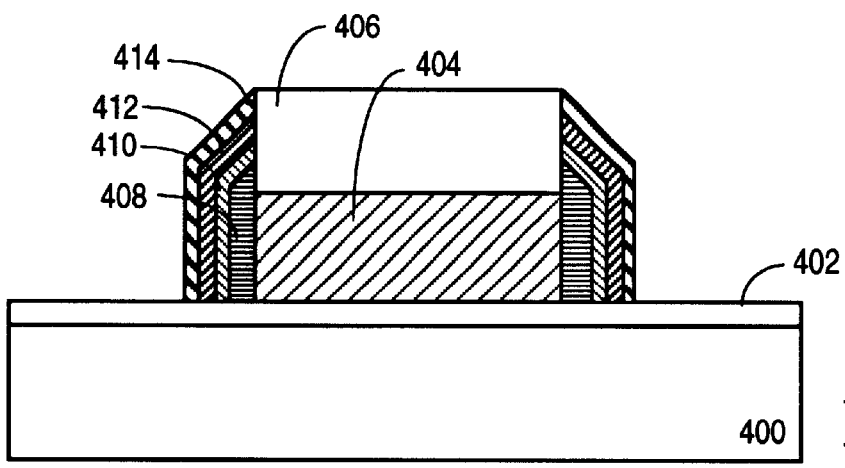
FIG. 20 illustrates a portion of a semiconductor substrate showing spacers formed along the sidewalls of a hardmask and a gate of a Metal-Oxide-Semiconductor field-Effect Transistor (MOSFET) in accordance with a fourth embodiment of the method of the present invention; and, FIG. 21 illustrates a flow chart diagram with the steps of a method for passivating an integrated circuit wafer according to one embodiment of the process of the present invention.

FIG. 20 illustrates a portion of a semiconductor device with spacers formed thereon. Spacers 408 are formed along the sidewalls of a hardmask 406 and a gate 404 of a Metal-Oxide-Semiconductor field-Effect Transistor (MOSFET), for example. Spacers 408 are passivated in an oxide layer 410, an adhesion layer 412, and a passivation layer 414 in accordance with an embodiment of the present invention. Spacer formation is well-known in the art. Spacers 408 are typically made of silicon nitride. However, it should be appreciated by those of ordinary skill in the art that spacers 408 may be made from other dielectric materials and may include a single dielectric layer, such as silicon dioxide, or several layers formed by various methods. In one embodiment, each spacer 408 is comprised of oxide layer 410 of silicon dioxide. An adhesion layer 412 of silicon oxynitride is formed when the silicon dioxide layer is exposed to a plasma treatment of nitrous oxide gas. In the embodiment described above, a passivation layer 414 made of silicon nitride, for example, is formed over adhesion layer 412, resulting in a strong chemical bond between oxide layer 410 and passivation layer 414.

Figure 21:
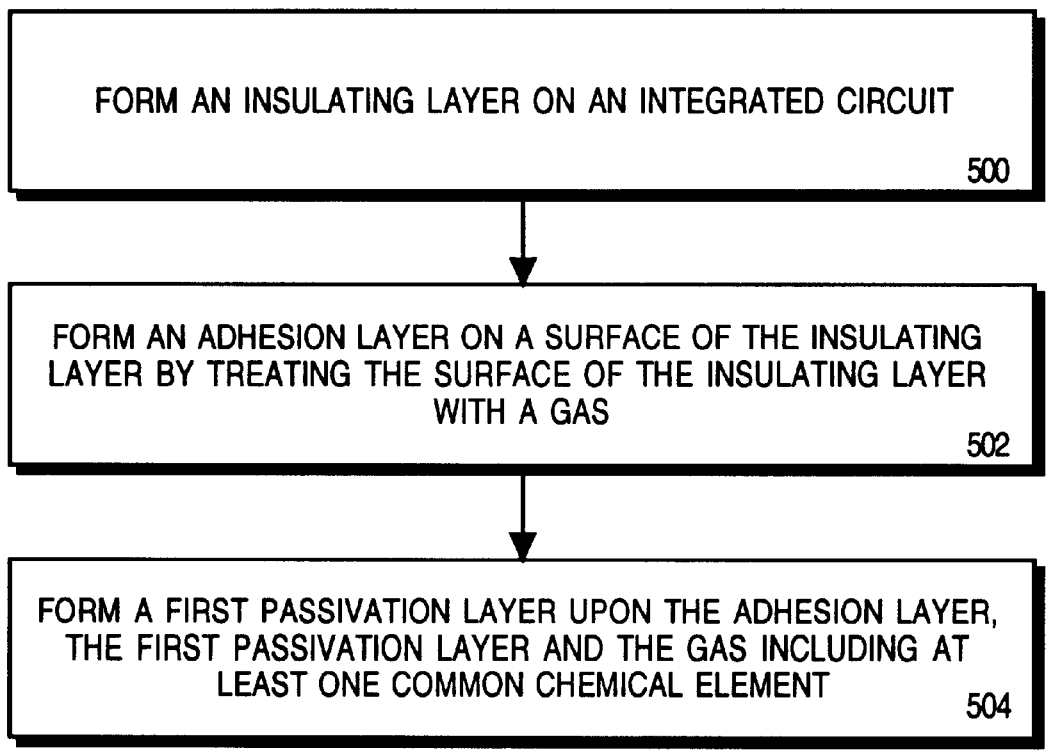

FIG. 21 illustrates a flow chart diagram with the steps of a method for passivating an integrated circuit wafer according to one embodiment of the process of the present invention. The method starts at block 500 where an insulating layer is formed on an integrated circuit. At step 502, an adhesion layer is formed on a surface of the insulating layer by treating the surface of the insulating layer with a gas. At step 504, a first passivation layer is formed upon the adhesion layer, the first passivation layer and the gas including at least one common chemical element.

In the previous detailed description, the invention is described with reference to specific embodiments thereof. It will, however, be evident that various modifications and changes may be made thereto without departing from the broader spirit and scope of the invention as set forth in the claims. The specification and drawings are, accordingly, to be regarded in an illustrative rather than a restrictive sense.

What is claimed is:

1. A method of passivating an integrated circuit, the method comprising in sequential order:

presenting a substrate having a top surface;

forming an insulating layer on the top surface of the substrate, the insulating surface having a top surface;

forming at least one conductive material structure on the top surface of the insulating layer, the at least one conductive material structure having a top surface and at least one side surface, the at least one side surface having a first portion and a second portion;

forming an adhesion layer on the top surface of the insulating layer and on the first portion of the at least one side surface of the at least one conductive material by treating the surface of the insulating layer with a gas, the adhesion layer having a top surface; and forming a first passivation layer on the top surface of the adhesion layer, on the second portion of the at least one side surface of the at least one conductive material, and on the top surface of the at least one conductive material, wherein the first passivation layer and the gas includes at least one common chemical element.

2. The method of claim 1, the first passivation layer having a top surface the method further comprising:

forming a second passivation layer on the top surface of the first passivation layer.

3. The method of claim 1, wherein the insulating layer includes silicon dioxide.

4. The method of claim 1 wherein the gas reacts with the surface of the insulating layer.

5. The method of claim 1, wherein the gas includes nitrous oxide ($N_2O$).

6. The method of claim 1, wherein the gas includes one of oxygen and nitrogen (N), oxygen and ammonia ($NH_3$), oxygen and argon (Ar), and ozone ($O_3$) and argon.

7. The method of claim 5, wherein the adhesion layer includes silicon oxynitride ($Si_xO_yN_z$).

8. The method of claim 7, wherein the first passivation layer includes silicon nitride.

9. The method of claim 1, wherein the first passivation layer is deposited on the adhesion layer by way of a process of plasma enhanced chemical vapor deposition (PECVD).

10. The method of claim 8, wherein the at least one common chemical element includes nitrogen (N).

11. The method of claim 2 wherein the second passivation layer includes polyimide.

12. A method of passivating an integrated circuit having a substrate, the method comprising in sequential order:

forming an oxide layer on the substrate of the integrated circuit;

forming at least one conductive material structure on the top surface of the oxide layer;

forming an adhesion layer on the oxide layer by treating the surface of the oxide layer with nitrous oxide gas; and forming a first passivation layer of silicon nitride on the adhesion layer.

13. The method of claim 12 further comprising forming a second passivation layer on the first passivation layer.

14. The method of claim 12, wherein the adhesion layer includes silicon oxynitride.

15. The method of claim 12, wherein the first passivation layer of silicon nitride is deposited on the adhesion layer by way of a process of plasma enhanced chemical vapor deposition (PECVD).

16. The method of claim 13, wherein the second passivation layer includes polyimide.

17. A method of passivating a trench on a semiconductor substrate, comprising in sequential order:

forming at least one trench in the semiconductor substrate;

forming an insulating layer on the at least one trench;

forming an adhesion layer on a surface of the insulating layer by treating the surface of the insulating layer with a gas; and, forming a first passivation layer on the adhesion layer, the first passivation layer and the gas including at least one common chemical element.

18. The method of claim 17, wherein the gas reacts with the surface of the insulating layer.

19. The method of claim 17, wherein the gas includes nitrous oxide ($N_2O$).

20. A method of passivating spacers, the method comprising in sequential order:

forming at least one spacer;

forming an insulating layer on the at least one spacer;

forming an adhesion layer on a surface of the insulating layer by treating the surface of the insulating layer with a gas; and, forming a first passivation layer on the adhesion layer, the first passivation layer and the gas including at least one common chemical element.

21. The method of claim 20, wherein the gas reacts with the surface of the insulating layer.

22. The method of claim 20, wherein the gas includes nitrous oxide ($N_2O$).

* * * * *

UNITED STATES PATENT AND TRADEMARK OFFICE
CERTIFICATE OF CORRECTION

PATENT NO. : 6,352,940 B1 Page 1 of 1
DATED : March 5, 2002
INVENTOR(S) : Seshan et al.

It is certified that error appears in the above-identified patent and that said Letters Patent is hereby corrected as shown below:

Column 6,
Line 41, delete "vapor".
Line 41, after "plasma" insert -- vapor --.

Column 7,
Lines 7, 13 and 17, delete "vapor".
Lines 7, 13 and 18, after "plasma" insert -- vapor --.

Signed and Sealed this

First Day of April, 2003

JAMES E. ROGAN
*Director of the United States Patent and Trademark Office*